United States Patent
Kerselaers et al.

(10) Patent No.: US 9,509,353 B2
(45) Date of Patent: Nov. 29, 2016

(54) DATA PROCESSING DEVICE

(71) Applicant: NXP B.V., Eindhoven (NL)

(72) Inventors: Anthony Kerselaers, Herselt (BE);
Liesbeth Gommé, Anderlecht (BE)

(73) Assignee: NXP B.V., Eindhoven (NL)

( * ) Notice: Subject to any disclaimer, the term of this patent is extended or adjusted under 35 U.S.C. 154(b) by 106 days.

(21) Appl. No.: 14/464,608

(22) Filed: Aug. 20, 2014

(65) Prior Publication Data

US 2016/0056851 A1    Feb. 25, 2016

(51) Int. Cl.
| | |
|---|---|
| H04B 1/40 | (2015.01) |
| H04B 1/16 | (2006.01) |
| H04B 1/04 | (2006.01) |
| H04B 1/14 | (2006.01) |
| H04B 1/28 | (2006.01) |
| H04B 17/29 | (2015.01) |
| H04B 1/00 | (2006.01) |
| H03L 7/085 | (2006.01) |

(Continued)

(52) U.S. Cl.
CPC .......... *H04B 1/1638* (2013.01); *H04B 1/0096* (2013.01); *H04B 1/0475* (2013.01); *H04B 1/14* (2013.01); *H04B 1/28* (2013.01); *H04B 17/29* (2015.01); *H03B 2201/03* (2013.01); *H03L 7/085* (2013.01); *H03L 7/095* (2013.01); *H03L 7/101* (2013.01)

(58) Field of Classification Search
CPC ....... H03L 7/08; H03L 7/0805; H03L 7/095; H03L 7/099; H03L 7/101; H03B 2201/02; H03B 2201/03; H03B 2201/031; H03B 2201/033
USPC ........ 455/183.1, 192.1, 198.1, 165.1, 75, 76
See application file for complete search history.

(56) References Cited

U.S. PATENT DOCUMENTS

| | | | | |
|---|---|---|---|---|
| 4,689,685 A | * | 8/1987 | Testin ...................... | H04N 5/50 348/735 |
| 5,101,509 A | * | 3/1992 | Lai ........................ | H03J 1/0008 455/183.1 |
| 5,212,554 A | * | 5/1993 | Tults ........................ | H04N 5/50 348/732 |

(Continued)

FOREIGN PATENT DOCUMENTS

| | | |
|---|---|---|
| EP | 1 911 185 B1 | 8/2006 |
| JP | 11251935 A1 | 9/1999 |
| JP | 11355172 A1 | 12/1999 |

OTHER PUBLICATIONS

Extended European Search Report for Patent Appln. No. 15181077.7 (Jan. 18, 2016).

*Primary Examiner* — Duc M Nguyen

(57) ABSTRACT

One example discloses a data processing device, comprising: a local oscillator (LO) having an LO frequency output, an LO performance parameter output, and an LO frequency select input; and a degradation detection module, coupled to the LO performance parameter output and to the LO frequency select input, and including an LO frequency select module triggered by the LO performance parameter output. Another example discloses an article of manufacture comprises at least one non-transitory, tangible machine readable storage medium containing executable machine instructions for controlling a data processing device which comprise: monitoring a set of local oscillator (LO) performance parameters; setting an LO degraded state when at least one of the LO performance parameters is not within a predetermined range; and adjusting an LO frequency in response to the LO degraded state.

12 Claims, 7 Drawing Sheets

(51) Int. Cl.
  *H03L 7/10* (2006.01)
  *H03L 7/095* (2006.01)

(56) References Cited

U.S. PATENT DOCUMENTS

| | | | | |
|---|---|---|---|---|
| 5,303,398 A * | 4/1994 | Tults | ........................ | H03J 7/065 455/182.1 |
| 6,483,391 B1 * | 11/2002 | Magoon | ..................... | H03L 5/00 331/182 |
| 7,599,140 B2 * | 10/2009 | Tsuyama | ................... | H03K 5/26 360/51 |
| 8,862,089 B2 * | 10/2014 | Wang | .................... | H03H 7/0153 455/307 |
| 2002/0168038 A1 * | 11/2002 | Damgaard | ............... | H03L 7/113 375/344 |
| 2003/0025566 A1 * | 2/2003 | Rogers | ................. | H03B 5/1231 331/109 |
| 2007/0049212 A1 * | 3/2007 | Dunworth | ................. | H03L 5/00 455/76 |
| 2007/0096841 A1 * | 5/2007 | Connell | .................... | H03B 5/06 331/183 |
| 2008/0180185 A1 * | 7/2008 | Fan | .......................... | H03L 5/00 331/117 R |
| 2012/0040628 A1 | 2/2012 | Krug et al. | | |

* cited by examiner

DATA PROCESSING DEVICE

Aspects of various example embodiments are directed to systems, methods, apparatuses, devices, articles of manufacture and computer readable mediums involving communication systems.

Wireless communication systems in cars can have many embodiments and uses including: car broadcast radios used for infotainment; cellular communication systems; handheld communication units; WLAN; Bluetooth; CAR2CAR; and CAR2X.

Certain example communication systems have a dedicated frequency band resulting in electromagnetic fields generated in and around the car. These fields have different strengths and different frequencies depending on the generating equipment. Broadcast radios are connected with a coaxial cable to at least one antenna but may be connected to more than one. These antennas convert the electromagnetic field from different broadcast stations into an electrical signal. In one example, the distance between the car and the broadcast stations can be relative large, perhaps on the order of many kilometers; however, the distance between the car communication antenna and one or more car broadcast antennas can be small, perhaps on the order of a few meters, and the communication systems may generate strong interference towards the broadcast receiver.

For example, a car shark fin antenna module may contain cellular communication functionality combined with active broadcast antenna functionality. The communication antennas are positioned in the shark fin together with active circuitry of the broadcast active antenna. More advanced shark fins may also contain the car2car communication antennas and electronics like the transceiver functionality. In one example, the shark fin antenna module includes a multiband antenna for the different cellular bands: GSM 900, GSM 1800 and UMTS; and a separate antenna for car2X communication operating at the 5.9 GHz band, together with a whip antenna for the reception of AM, FM and DAB broadcast.

Strong electromagnetic fields from the communication systems in the shark fin or in the car at other frequencies than the broadcast reception frequencies can degrade the performance of various receivers connected to such an antenna module.

One example of a communication system is a heterodyne broadcast radio receiver system. Such a system may include an antenna for receiving a first range of radio frequencies (RF), a band selector (BS), having a band pass filter covering a predetermined broadcast band (e.g. an FM band from 87.5 MHz to 108 MHz), a low noise amplifier (LNA), a mixer, a local oscillator and an intermediate frequency (IF) band pass filter. The IF filter includes suitable bandwidth for selecting various broadcast stations, and in one example may be about 250 KHz wide.

During one example of the radio receiver's operation, an FM radio station transmits a first program at a certain channel frequency, for example at 97 MHz in the FM frequency band. Another radio station transmits a second program at another RF frequency, for example at 98 MHz, wherein both the first and second programs have a bandwidth of 220 KHz. To be able to select between the two programs the radio receiver uses an IF selectivity function, perhaps having an output bandwidth of 250 KHz, which is sufficient to include each program's 220 KHz bandwidth.

If the IF selectivity function is implemented at the RF frequency, the band selector (BS) components having a very high quality factors are required. However, if the RF broadcast frequency is down-converted to a lower intermediate frequency (IF), such as 10.7 MHz, lower quality factor components may be used.

To convert the broadcast transmitter RF frequency to the IF frequency a mixer can be used together with a local RF oscillator signal generated within the receiver. By varying the local RF oscillator frequency, the receiver can convert (i.e. tune) a range of RF broadcast frequencies to the same (or nearly the same) IF frequency.

For example, to convert a 97 MHz broadcast RF frequency to a 10.7 MHz intermediate frequency, the local oscillator frequency can be set at either 107.7 MHz or 86.3 MHz, according to Equations 1 and 2.

$$F_{intermediate} = |F_{broadcast} - F_{oscillator}| \quad \text{(Equation 1)}$$

$$F_{intermediate} = |F_{oscillator} - F_{broadcast}| \quad \text{(Equation 2)}$$

According to an example embodiment, a data processing device, includes: a local oscillator (LO) having an LO frequency output, an LO performance parameter output, and an LO frequency select input; and a degradation detection module, coupled to the LO performance parameter output and to the LO frequency select input, and including an LO frequency select module triggered by the LO performance parameter output.

According to another example embodiment, an article of manufacture comprises at least one non-transitory, tangible machine readable storage medium containing executable machine instructions for controlling a data processing device which comprise: monitoring a set of local oscillator (LO) performance parameters; setting an LO degraded state when at least one of the LO performance parameters is not within a predetermined range; and adjusting an LO frequency in response to the LO degraded state.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

BRIEF DESCRIPTION OF THE DRAWINGS

FIGS. 4A and 4B are examples of a high frequency band received by the data processing device.

Figure 1:
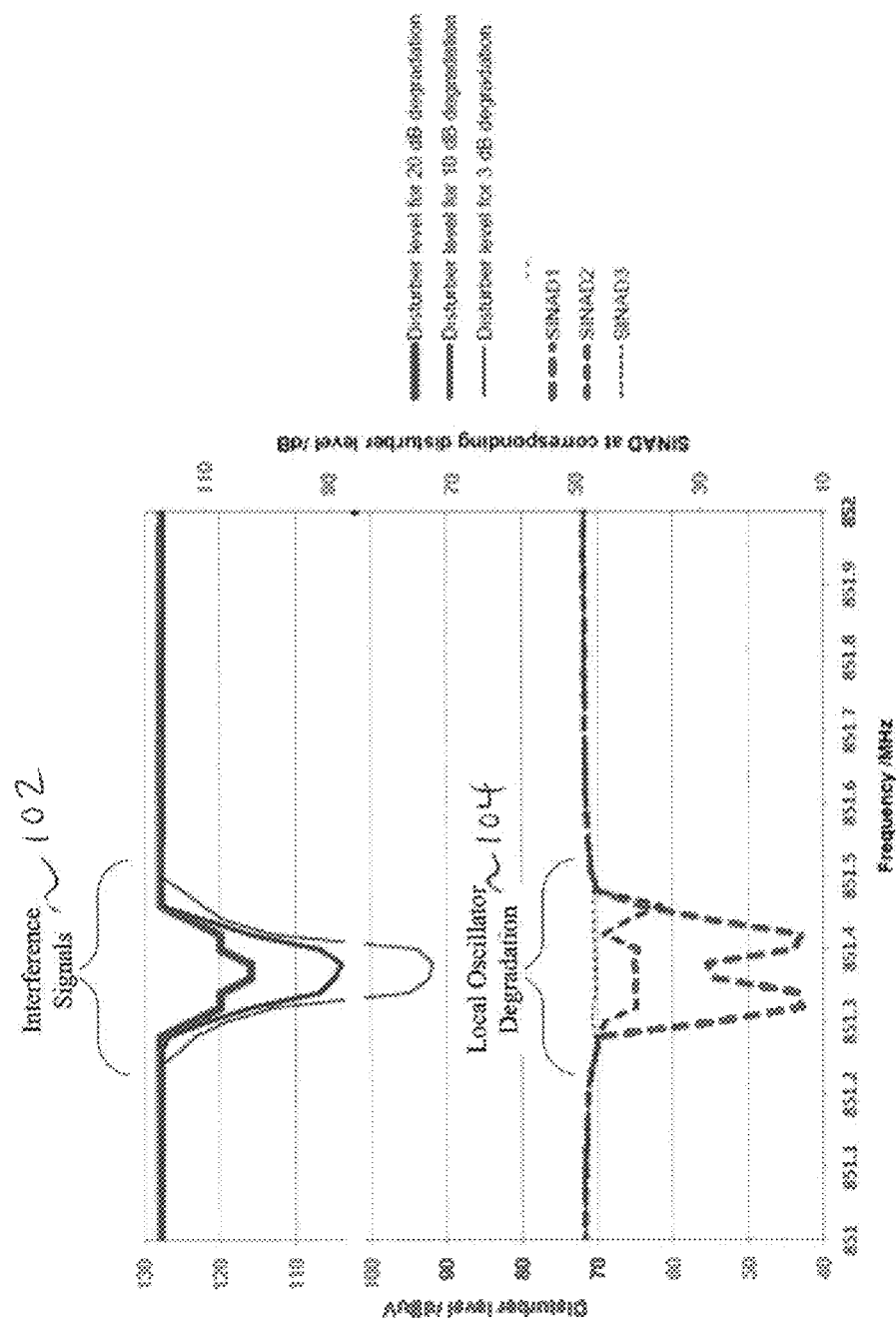
FIG. 1 is an example frequency graph of a set interference signals and corresponding local oscillator degradation.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Local oscillator systems in various devices and at various frequencies can be degraded by interfering signals that have some sort of a frequency relation with the local oscillator signal (e.g. remote or local signals, in-band or signals, signals generated from a common power supply, etc.). One example of degradation is spurious modulation of a local oscillator's output signal, causing spurious amplitude variations and/or frequency variations.

For example, a cellular system and an FM broadcast radio antenna are often in close proximity within a car. When the cellular communications system, operating according GSM900, would transmit at a frequency of 851.35 MHz, a very strong field in and near the car's FM broadcast radio antenna is generated. Such a field strength can be on the order of 30 Volts/meters or even higher. Such a strong electromagnetic field may influence the FM broadcast radio reception quality.

In one example a broadcast radio signal is decoupled from an interference signal which is somehow related to the local oscillator frequency by: monitoring a set of local oscillator performance parameters; comparing the performance parameters to a calibrated set of performance parameters; and changing the local oscillator frequency in a step-wise manner which still permits a desired channel (e.g. a broadcast radio station) to be processed by other devices and/or presented to a user;

Such an embodiment can reduce or practically eliminate electromagnetic and/or direct electrical coupling between an interference signal and the local oscillator, and will likely not introduce audible distortions when combined with an audio concealment algorithm. Such embodiments can be embedded in a car broadcast radio, another kind of receiver, transmitter or transceiver.

FIG. 1 is an example frequency graph of a set interference signals 102 and corresponding local oscillator degradation 104. The measurement shows the results of radio performance degradation due to a strong interference signal. Such audio degradation is in some examples due to interference with a communications device's local oscillator frequency when there is a harmonic relation between the interfering signal's frequency and the local oscillator's frequency. In this example, the broadcast radio's local oscillator frequency is at 94.6 MHz and if a GSM cellular device would be transmitting at 851.35 MHz, this would equal the $9^{th}$ harmonic of the radio's local oscillator frequency.

Figure 2:
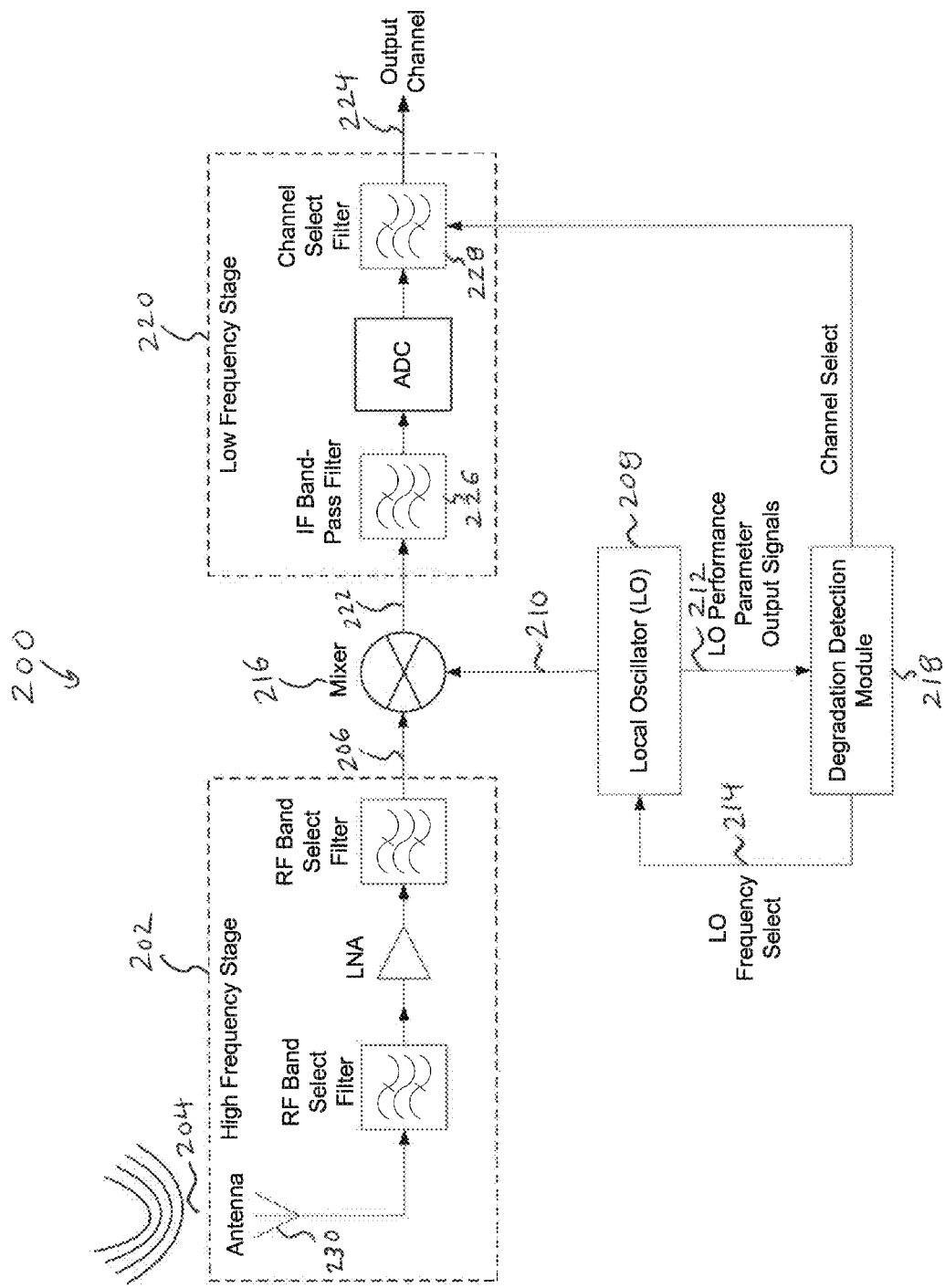
FIG. 2 is an example data processing device.

FIG. 2 is an example data processing device 200. The data processing device 200 includes a high frequency stage 202, a high frequency band input 204, a high frequency band output 206, a local oscillator (LO) 208, an LO frequency output 210, an LO performance parameter output 212, an LO frequency select input 214, a mixer 216, a degradation detection module 218, a low frequency stage 220, a low frequency band input 222, and a channel output 224.

The data processing device 200 in various example embodiments can be either: a receiver, a transmitter, a transceiver; a radio; a communications device; a phone; a cellular device; a WLAN device; a Bluetooth device; a CAR2CAR device; or a CAR2X device. Other embodiments of the data processing device 200 are also possible.

The high frequency stage 202 receives a data channel at a high frequency from the high frequency band input 204. In one example, the data channel at the high frequency is within an FM radio band, and the data channel includes a set of data channels (e.g. multiple broadcast stations). The high frequency band input 204 is herein defined as the interface between the received high frequency data channel and an antenna 230.

The high frequency stage 202 may also include various RF band select (BS) filters and a low noise amplifier (LNA) as shown in FIG. 2. In one example, at least one of the RF band select filters has a center frequency of 98 MHz and a bandwidth (i.e. 21 MHz) covering the complete FM band, from 87 MHz to 108 MHz, and shown and later discussed in FIGS. 4A and 4B.

The mixer 216 receives the high frequency data channel from the high frequency stage 202 and the LO frequency output 210 from the LO 208. Using the LO 208 output frequency, the mixer 216 coverts the high frequency data channels to a set of low frequency data channels and presents them to the low frequency band input 222 of the low frequency stage 220. In one example, high RF frequency data channels are converted to low intermediate frequency (IF) data channels (e.g. +/−0 Hz), such as when the data processing device 200 is a data receiver. Note that in other example embodiments, the data processing device 200 can be a transmitter or transceiver function.

Figure 5:
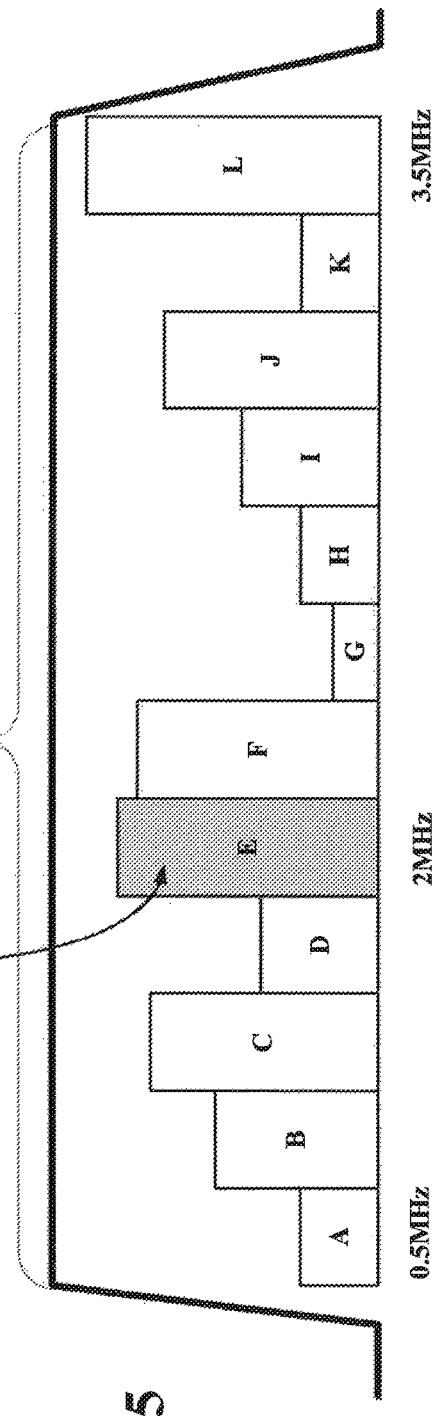
FIG. 5 is an example first set of down-converted channels.
Figure 6:
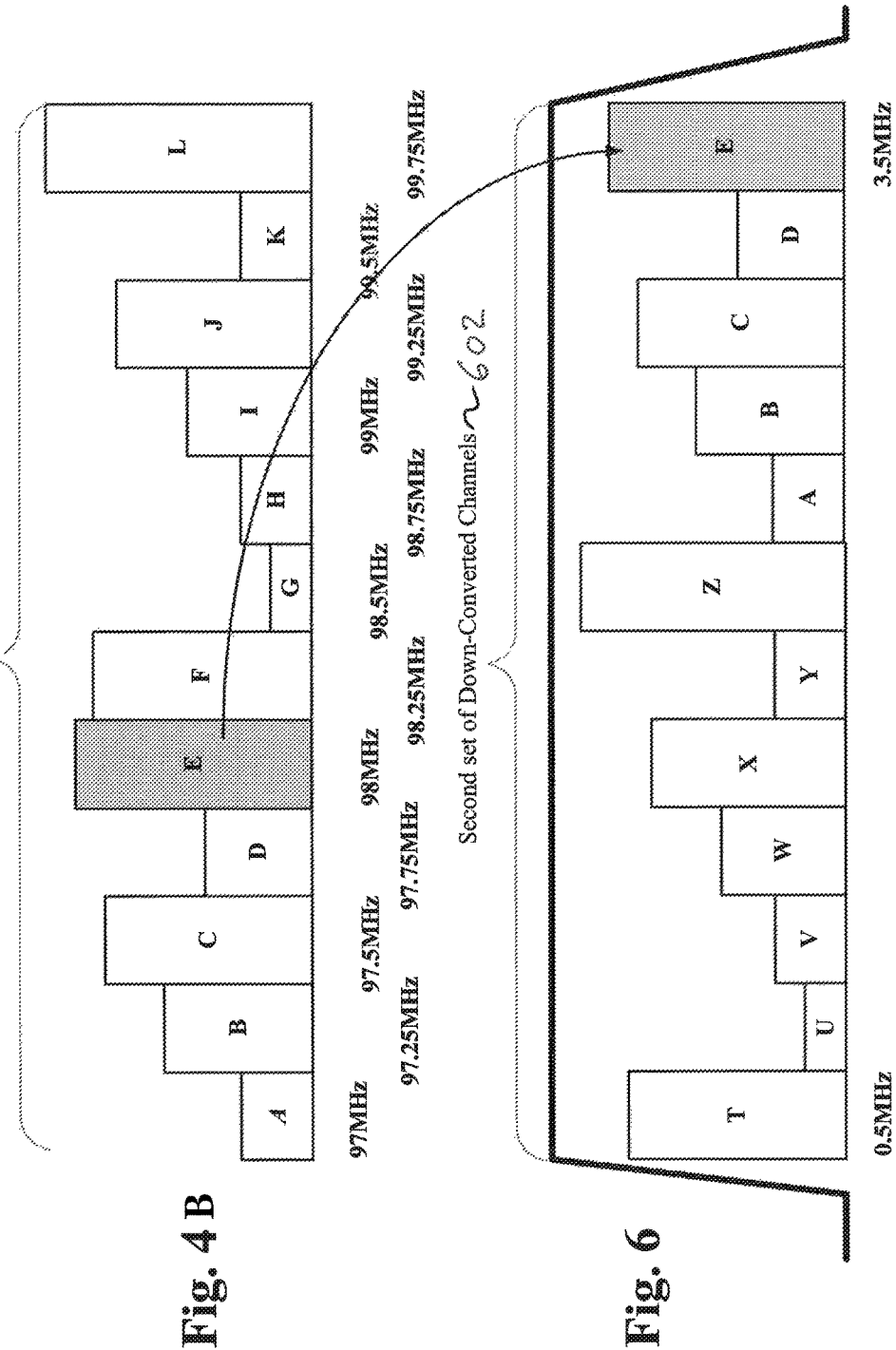
FIG. 6 is an example second set of down-converted channels.

The low frequency stage 220 includes an IF band-pass filter 226, a channel select filter 228 and an ADC. Any selected data channel from the set of high frequency data channels must, in one example, be within the IF band-pass filter 226 pass-band so as to be later presented at the low frequency stage 220 output 224 for later processing. For example, a 3 MHz wide IF band-pass filter 226 is wide enough to select multiple broadcast stations within an FM band. FIGS. 5 and 6 show such an example IF pass-band, and are discussed below.

The degradation detection module 218 receives a set of performance parameters from the LO 208 over the LO performance parameter output, and upon detection of a degraded LO condition (i.e. the device 200 is in an LO degraded state), sends a command over the LO frequency select input 214 to change the LO 208 frequency. The LO degraded state is entered when one or more signals on the LO performance parameter output is not within a predetermined range.

The degradation detection module 218 ensures that any selected high frequency data channel from the high frequency stage 202 are still confined (e.g. still fall within) the IF band-pass filter's 226 pass-band, and thus can be further processed by the low frequency stage 220 and any subsequent circuitry. If a particular change in the LO 208 frequency would cause one or more of the selected high frequency data channels to fall outside of the IF band-pass filter's 226 pass-band, the degradation detection module 218 will select a different LO 208 frequency. Example routines for detecting and remediating LO 208 signal degradation are discussed in FIG. 3.

Once the LO 208 is not degraded, additional processing may include digitizing a set of the high frequency data channels with an analogue to digital converter (ADC) and selecting one of the channels using a narrower bandwidth channel select filter 228. For example, if the high frequency data channels include 12 FM band radio stations, the degradation detection module 218 can select just one of the FM band radio stations, using the narrower bandwidth channel select filter 228, for further base-band processing and presentation to a user.

Figure 3:
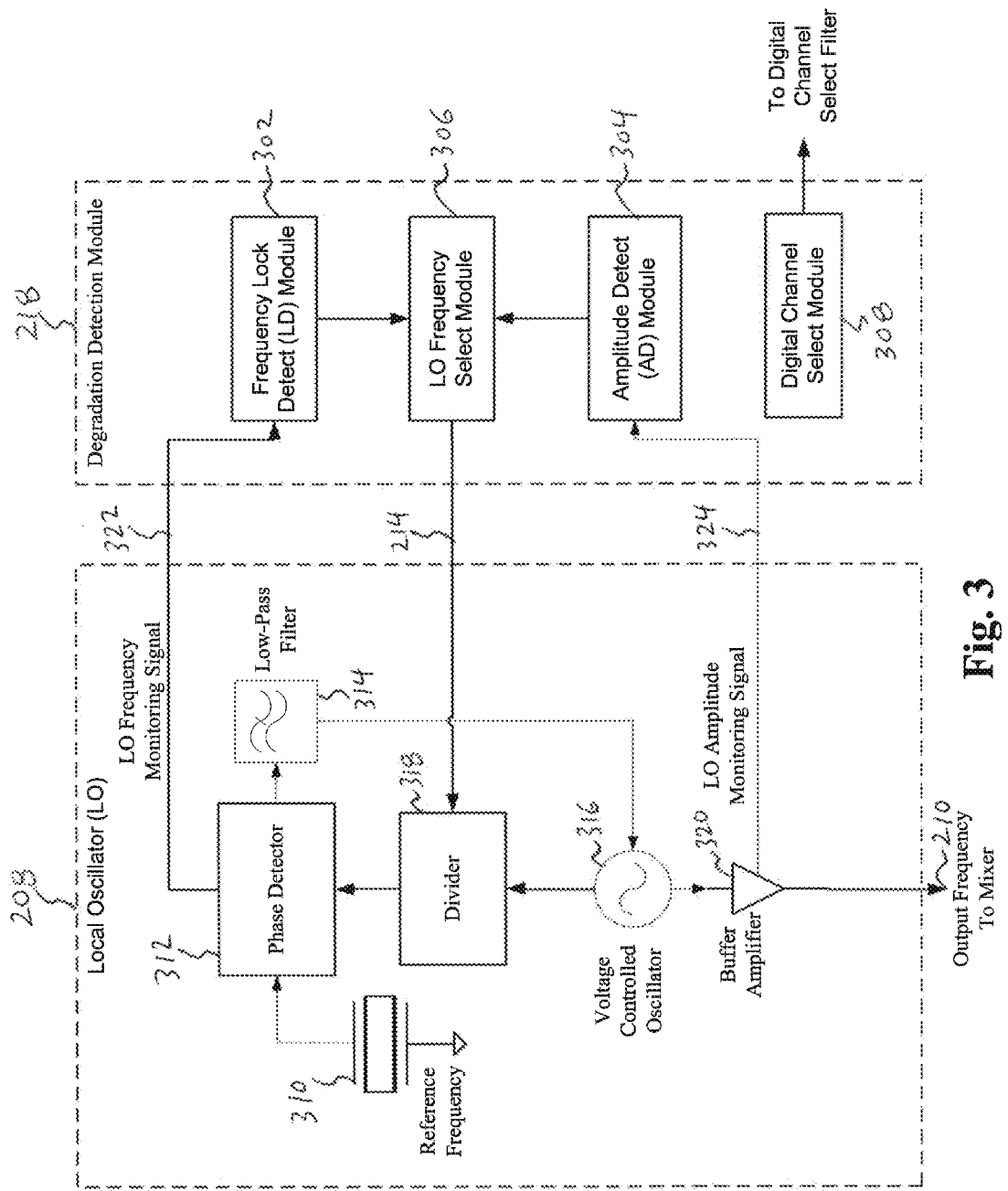
FIG. 3 is an example local oscillator and degradation detection module within the data processing device.

FIG. 3 is an example local oscillator 208 and degradation detection module 218 within the data processing device 200. In this example the degradation detection module 218 includes a frequency lock detect (LD) module 302, an amplitude detect (AD) module 304, an LO frequency select module 306, and a digital channel select module 308.

The LO 208 includes a reference frequency (XTAL) 310, a phase detector 312 low-pass filter 314, a voltage controlled oscillator (VCO) 316, a divider 318, and a buffer amplifier 320.

The local oscillator output frequency 210 is stabilized in a feedback system that consists of comparing the reference frequency 310 with the divided 318 frequency of the VCO 316. The local oscillator's 208 VCO 316 signal is also buffered and amplified 320 and then presented at the output 210 which is sent to the mixer 216.

Whenever at least one of the LO performance parameter output 212 signals are not within their predetermined range, an LO 208 degraded state is indicated and the degradation detection module 218 commands the LO frequency select module 306 to tune the LO 208 to a new LO frequency. Some specific example routines for detecting and remediating LO 208 signal degradation are now discussed.

In a first example, the frequency lock detect (LD) module 302, in the degradation detection module 218, monitors the LO frequency monitoring signal 322, on the LO performance parameter output 212, and sets the LO unlocked state when a frequency on the LO frequency output 210 is not locked to a frequency from the LO frequency reference 310 circuit.

In a second example, the amplitude detect (AD) module 304, in the degradation detection module 218, monitors the LO amplitude monitoring signal 324, on the LO performance parameter output 212, and sets an LO amplitude invalid state when an amplitude on the LO amplitude monitoring output 324 is not within a predetermined range.

Since there is often some small intrinsic amplitude modulation that is generated by imperfections within the local oscillator 208, the LO degraded state is not set by the degradation detection module 218 until the amplitude variation exceeds a predetermined threshold. In one example, the threshold level is programmable and can be set for example 10% above the LO's 208 intrinsic amplitude modulation. The threshold level can be set during testing and tuning to maximize reliable operation of the data processing device 200 (e.g. a radio broadcast receiver). In a certain example embodiments the threshold can be set based on a known isolation level between multiple antennas packaged together in a same antenna unit. The isolation between the antennas can be used to define the interference power. An external interference source strength/power exceeding the isolation level then defines an unacceptable degradation which sets the LO degraded state and triggers the degradation detection module 218 to change the LO 208 frequency.

In response to such LO performance parameter out of tolerance conditions, the degradation detection module 218 then commands the LO frequency select module 306 to send a new frequency select signal to the LO frequency select input 214 of the LO 208. The LO frequency select input 214 is connected to the divider 318 and thus can adjust the VCO 316 frequency sent to the phase detector 312, which in turn alters the output frequency of the VCO 316 presented on the LO output 210.

The LO 208 frequency can be adjusted in a variety of ways. For example, by adjusting (e.g. increasing, decreasing, stepping, jumping to a pre-set, etc.) the local oscillator 208 frequency until the LO degradation is below a predetermined threshold. Then verifying that all selected high frequency data channels are still within the IF band-pass filter's 226 pass-band. If not, then iterating the adjusting and verifying until all of the selected high frequency data channels are within the IF band-pass filter's 226 pass-band.

In another example, F_local_oscillator is the current oscillator frequency that is degraded. Then setting F_local_oscillator_new=F_local_oscillator+STEP, where STEP=minimal possible frequency step, usually 1 channel, for example 250 KHz for an FM band radio station channel. If |F_local_oscillator_new−F_broadcast|>IF pass band, then F_local_oscillator_new=F_local_oscillator−2×STEP. This last step occurs if up-converting the selected channel by one STEP would place is outside of the IF selection filter band, thereby requiring that the selected channel be down-converted by at least two steps, thereby placing the LO frequency at least one STEP below its original frequency.

Figure 4A:
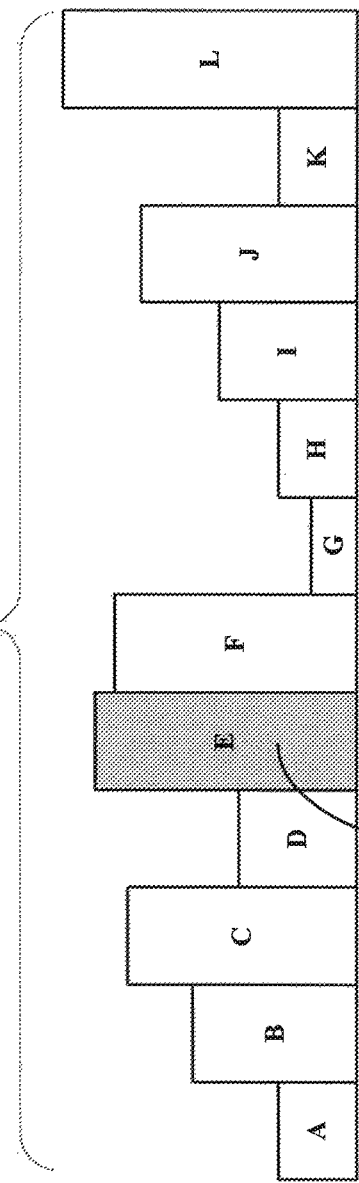

FIGS. 4A and 4B are an example set of high frequency channels 402 received by the data processing device 200. The set of high frequency channels 402, in this example, represent twelve FM band radio station channels having frequencies ranging from 97 MHz to 100 MHz, and labeled as channels A through L. Channel E is highlighted to indicate that channel E has been selected for further processing by the low frequency stage 220 and any subsequent base-band circuits.

FIG. 5 is an example first set of down-converted channels 502. The first set of down-converted channels 502 represent the set of high frequency channels 402 which have been down-converted by the mixer 216 to within a 3 MHz bandwidth of the band-pass filter 226 in the low frequency stage 220. Channel E originally had an RF frequency of 98 MHz which after mixing with a 96 MHz LO 208 frequency is converted to an intermediate frequency of 2 MHz.

FIG. 6 is an example second set of down-converted channels 602. The second set of down-converted channels 602 is generated if the degradation detection module 218 determines that the LO 208 at 96 MHz is degraded. In response to the detected degradation, the degradation detection module 218 commands the LO 208 to change the LO frequency to 94.5 MHz.

Such a lower LO 208 frequency converts one spectral lobe of Channel E to a higher intermediate frequency of 3.5 MHz (i.e. 98 MHz-94.5 MHz=3.5 MHz). In this example, 94.5 MHz is the lowest LO 208 frequency allowable if Channel E has been selected, since a lower LO 208 frequency would place Channel E outside of the band-pass filter's 226 pass-band.

In other example embodiments, Channel E can be mixed with frequencies within the range of 94.5 MHz to 97.5 MHz, just as long as Channel E is converted to a frequency which still falls within the band-pass filter's 226 pass-band.

Note that the second set of down-converted channels 602 includes a second set of twelve RF channel frequencies ranging from 95.25 MHz to 98.25 MHz, and labeled as channels T through E This second set of twelve RF channel frequencies includes channels A through E from the first set of down-converted channels 502, and channels T through Z of the second set of RF channel frequencies down-converted to the intermediate frequencies and filtered.

Figure 7:
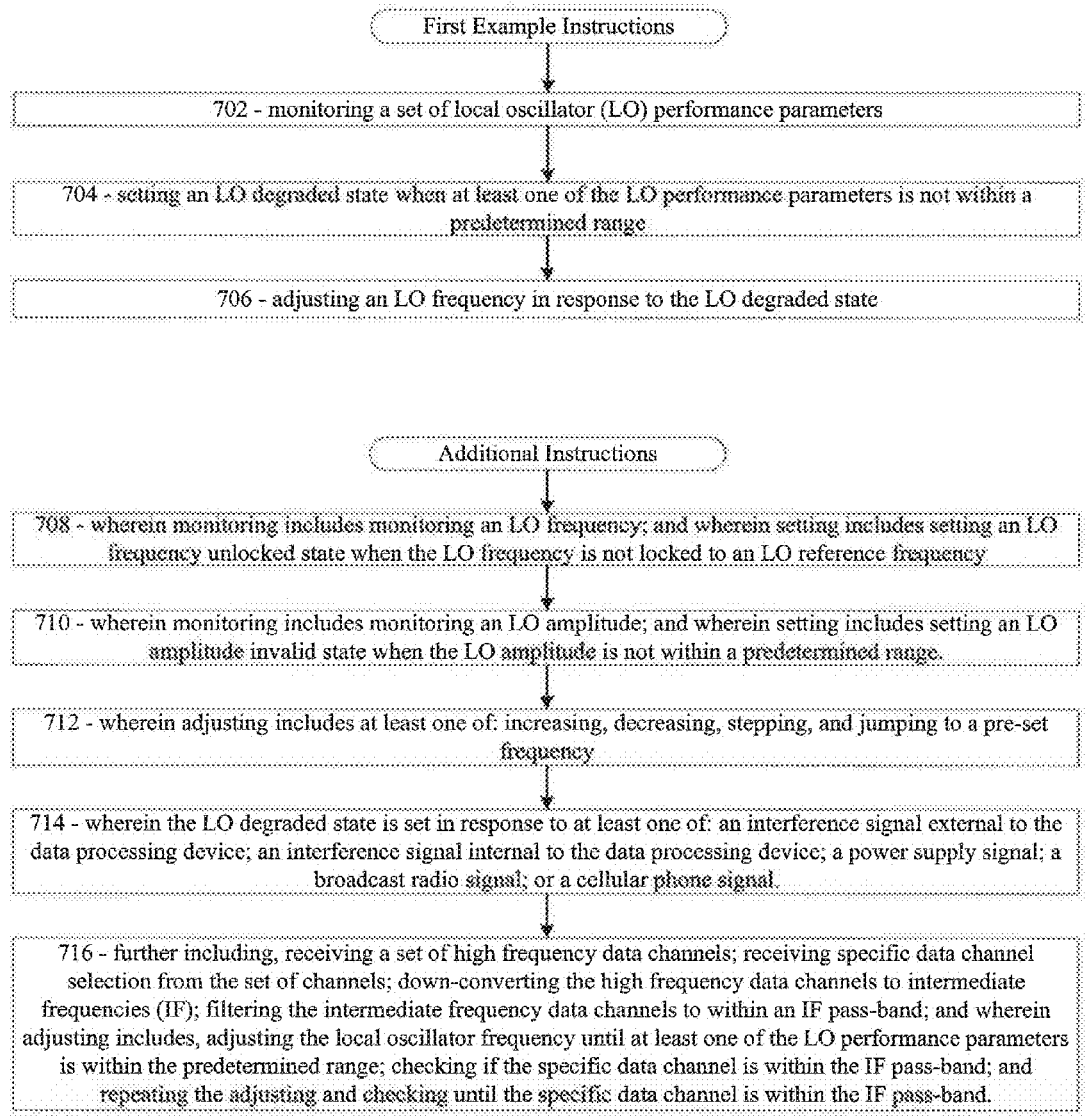
FIG. 7 is an example set of instructions for operating a data processing device.

FIG. 7 is an example set of instructions for operating a data processing device 200.

The instructions 700 begin in block 702, by monitoring a set of local oscillator (LO) performance parameters. In block 704, setting an LO degraded state when at least one of the LO performance parameters is not within a predetermined range. Then in block 706 adjusting an LO frequency in response to the LO degraded state.

The instructions can be augmented with one or more of the following additional instructions blocks, presented in no particular order.

In block 708, wherein monitoring includes monitoring an LO frequency; and wherein setting includes setting an LO frequency unlocked state when the LO frequency is not locked to an LO reference frequency.

In block 710, wherein monitoring includes monitoring an LO amplitude; and wherein setting includes setting an LO amplitude invalid state when the LO amplitude is not within a predetermined range.

In block 712, wherein adjusting includes at least one of: increasing, decreasing, stepping, and jumping to a pre-set frequency.

In block 714, wherein the LO degraded state is set in response to at least one of: an interference signal external to the data processing device; an interference signal internal to the data processing device; a power supply signal; a broadcast radio signal; or a cellular phone signal.

In block 716, further including, receiving a set of high frequency data channels; receiving specific data channel selection from the set of channels; down-converting the high frequency data channels to intermediate frequencies (IF); filtering the intermediate frequency data channels to within an IF pass-band; and wherein adjusting includes, adjusting the local oscillator frequency until at least one of the LO performance parameters is within the predetermined range; checking if the specific data channel is within the IF pass-band; and repeating the adjusting and checking until the specific data channel is within the IF pass-band.

These instructions have been presented in one example order of execution, however, other orderings, such as discussed with respect to FIGS. 2-6, are also possible. Also, those skilled in the art will recognize that while one example set of instructions/method has been discussed, the material in this specification can be combined in a variety of ways to yield other examples as well, and are to be understood within a context provided by this detailed description.

Figure 8:
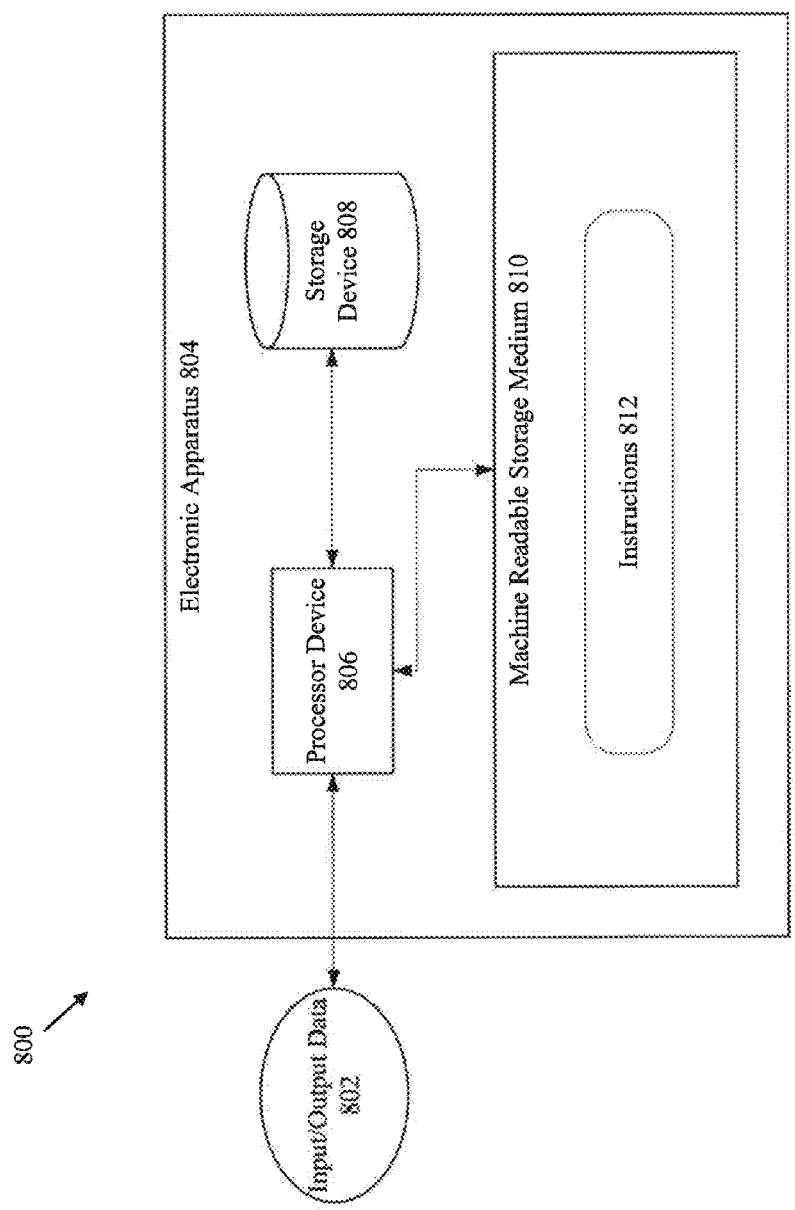
FIG. 8 is another example of a data processing device.

FIG. 8 is another example 800 of a data processing device. The diagram 800 shows an input/output data 802 interface with an electronic apparatus 804. The electronic apparatus 804 includes a processor 806, a storage device 808, and a machine-readable storage medium 810. The machine-readable storage medium 810 includes instructions 812 which control how the processor 806 receives input data 802 and transforms the input data into output data 802, using data within the storage device 808. Example instructions 812 stored in the machine-readable storage medium 810 are discussed elsewhere in this specification. The machine-readable storage medium in an alternate example embodiment is a computer-readable storage medium.

The processor (such as a central processing unit, CPU, microprocessor, application-specific integrated circuit (ASIC), etc.) controls the overall operation of the storage device (such as random access memory (RAM) for temporary data storage, read only memory (ROM) for permanent data storage, firmware, flash memory, external and internal hard-disk drives, and the like). The processor device communicates with the storage device and non-transient machine-readable storage medium using a bus and performs operations and tasks that implement one or more blocks stored in the machine-readable storage medium. The machine-readable storage medium in an alternate example embodiment is a computer-readable storage medium.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A data processing device, comprising:
a local oscillator (LO) having an LO frequency output, an LO performance parameter output, and an LO frequency select input; and
a degradation detection module, coupled to the LO performance parameter output and to the LO frequency select input, and including an LO frequency select module triggered by the LO performance parameter output;
a mixer;
a high frequency stage coupled to pass a data channel at a high frequency to a first mixer input; and
a low frequency stage, having a band-pass filter, and coupled to receive the data channel at a low frequency from an output of the mixer; and
wherein the LO frequency output is coupled to a second mixer input;
wherein the degradation detection module further includes:
an LO degraded state when a signal on the LO performance parameter output is not within a predetermined range; and
wherein the LO frequency select module, is coupled to the LO frequency select input, and includes an LO frequency step circuit triggered by the LO degraded state and which confines the low frequency data channel to within the band-pass filter.

2. The device of claim 1:
wherein the LO includes an LO frequency reference circuit;
wherein the LO performance parameter output includes an LO frequency monitoring output; and
wherein the degradation detection module further comprises:
a frequency lock detect (LD) module, coupled to the LO frequency monitoring output, and having an LO unlocked state when a frequency on the LO frequency output is not locked to a frequency from the LO frequency reference circuit; and
an LO frequency select module, coupled to the LO frequency select input, and having an LO frequency step circuit triggered by the LO unlocked state.

3. The device of claim 1:
wherein the LO performance parameter output includes an LO amplitude monitoring output; and
wherein the degradation detection module further comprises:
an amplitude detect (AD) module, coupled to the LO amplitude monitoring output, and having an LO amplitude invalid state when an amplitude on the LO amplitude monitoring output is not within a predetermined range; and an LO frequency select module, coupled to the LO frequency select input, and having an LO frequency step circuit triggered by the LO amplitude invalid state.

4. The device of claim 1:
wherein the data channel at the high frequency is within a broadcast radio band; and
wherein the data channel at the low frequency is within an intermediate band of frequencies which is less than the broadcast radio band.

5. The device of claim 1:
wherein the data channel includes a set of data channels; and
wherein the LO frequency select module confines at least one of the low frequency data channels to within the band-pass filter.

6. The device of claim 1:
wherein the data processing device is at least one of: a receiver, a transmitter, a transceiver; a radio; a communications device; a phone; a cellular device; a WLAN device; a Bluetooth device; a CAR2CAR device; or a CAR2X device.

7. An article of manufacture comprises at least one non-transitory, tangible machine readable storage medium containing executable machine instructions for controlling a data processing device which comprise:
monitoring a set of local oscillator (LO) performance parameters;
setting an LO degraded state when at least one of the LO performance parameters is not within a predetermined range; and
adjusting an LO frequency in response to the LO degraded state;
receiving a set of high frequency data channels;
receiving specific data channel selection from the set of channels;
down-converting the high frequency data channels to intermediate frequencies (IF);
filtering the intermediate frequency data channels to within an IF pass-band; and
wherein adjusting includes,
adjusting the local oscillator frequency until at least one of the LO performance parameters is within the predetermined range;
checking if the specific data channel is within the IF pass-band; and
repeating the adjusting and checking until the specific data channel is within the IF pass-band.

8. The article of claim 7:
wherein monitoring includes monitoring an LO frequency; and
wherein setting includes setting an LO frequency unlocked state when the LO frequency is not locked to an LO reference frequency.

9. The article of claim 7:
wherein monitoring includes monitoring an LO amplitude; and
wherein setting includes setting an LO amplitude invalid state when the LO amplitude is not within a predetermined range.

10. The article of claim 7:
wherein adjusting includes at least one of: increasing, decreasing, stepping, and jumping to a pre-set frequency.

11. The article of claim 7, further comprising:
selecting the specific data channel from within the IF pass-band.

12. The article of claim 7:
wherein the LO degraded state is set in response to at least one of: an interference signal external to the data processing device; an interference signal internal to the data processing device; a power supply signal; a broadcast radio signal; or a cellular phone signal.

* * * * *